United States Patent
Shin et al.

(10) Patent No.: US 8,384,350 B2
(45) Date of Patent: Feb. 26, 2013

(54) BATTERY CELL VOLTAGE BALANCING DEVICE

(75) Inventors: Inchul Shin, Daejeon (KR); Jongmoon Yoon, Daejeon (KR); Minchul Jang, Daejeon (KR); Jaeseong Yeo, Daejon (KR); Eun Ji Yoo, Seongnam-si (KR)

(73) Assignee: LG Chem, Ltd., Seoul (KR)

( * ) Notice: Subject to any disclaimer, the term of this patent is extended or adjusted under 35 U.S.C. 154(b) by 270 days.

(21) Appl. No.: 12/858,135

(22) Filed: Aug. 17, 2010

(65) Prior Publication Data
US 2011/0062915 A1    Mar. 17, 2011

Related U.S. Application Data

(63) Continuation of application No. PCT/KR2010/002833, filed on May 4, 2010.

(30) Foreign Application Priority Data

May 6, 2009 (KR) .................... 10-2009-0039312

(51) Int. Cl.
*H02J 7/00* (2006.01)
(52) U.S. Cl. .................. 320/113; 320/107; 320/110
(58) Field of Classification Search ............. 320/107, 320/110, 113, 126, 162
See application file for complete search history.

(56) References Cited

U.S. PATENT DOCUMENTS

| | | | |
|---|---|---|---|
| 7,952,330 B2 * | 5/2011 | Mori | 320/150 |
| 2003/0033711 A1 | 2/2003 | Lee et al. | |
| 2003/0213121 A1 * | 11/2003 | Rouillard et al. | 29/623.2 |
| 2005/0088140 A1 * | 4/2005 | Bushong et al. | 320/107 |
| 2006/0170394 A1 | 8/2006 | Ha et al. | |
| 2008/0054842 A1 * | 3/2008 | Kim et al. | 320/101 |

FOREIGN PATENT DOCUMENTS

| | | |
|---|---|---|
| KR | 10-0590050 B1 | 6/2006 |
| KR | 10-2008-0096628 A | 10/2008 |

* cited by examiner

*Primary Examiner* — Edward Tso
*Assistant Examiner* — Aaron Piggush
(74) *Attorney, Agent, or Firm* — Birch, Stewart, Kolasch & Birch, LLP

(57) ABSTRACT

Disclosed herein is a battery cell voltage balancing device for connecting two or more battery cells to one another in parallel so as to minimize a voltage difference between the respective battery cells, the battery cell voltage balancing device including an insulative main body having partitions, between which the two or more battery cells are mounted, respectively, configured in a structure in which the partitions are open upward, terminal connection parts disposed at opposite ends of the insulative main body for connecting cathodes and anodes of the battery cells mounted at the insulative main body to cathodes and anodes of neighboring battery cells mounted at the insulative main body, and an interval adjustment unit for variably adjusting an interval between the partitions in a state in which the battery cells are mounted between the partitions to achieve secure mounting of the battery cells between the respective partitions and electrical connection of electrode terminals of the respective battery cells to the terminal connection parts.

19 Claims, 3 Drawing Sheets

BATTERY CELL VOLTAGE BALANCING DEVICE

CROSS REFERENCE TO RELATED APPLICATIONS

This application is a Continuation of PCT International Application No. PCT/KR2010/002833 filed on May 4, 2010, which claims the benefit of Patent Application No. 10-2009-0039312 filed in Republic of Korea, on May 6, 2009. The entire contents of all of the above applications is hereby incorporated by reference into the present application.

TECHNICAL FIELD

The present invention relates to a battery cell voltage balancing device, and, more particularly, to a battery cell voltage balancing device for connecting two or more battery cells to one another in parallel so as to minimize a voltage difference between the respective battery cells, the battery cell voltage balancing device including an insulative main body having partitions, between which the two or more battery cells are mounted, respectively, configured in a structure in which the partitions are open upward, terminal connection parts disposed at opposite ends of the insulative main body for connecting cathodes and anodes of the battery cells mounted at the insulative main body to cathodes and anodes of neighboring battery cells mounted at the insulative main body, and an interval adjustment unit for variably adjusting an interval between the partitions in a state in which the battery cells are mounted between the partitions to achieve secure mounting of the battery cells between the respective partitions and electrical connection of electrode terminals of the respective battery cells to the terminal connection parts.

BACKGROUND ART

As mobile devices have been increasingly developed, and the demand for such mobile devices has increased, the demand for secondary batteries has also sharply increased. Among such secondary batteries is a lithium secondary battery having high energy density and operating voltage and excellent preservation and service-life characteristics, which has been widely used as an energy source for various electronic products as well as for the mobile devices.

Also, the secondary batteries have attracted considerable attention as an energy source for electric vehicles, hybrid electric vehicles, and plug-in hybrid electric vehicles, which have been developed to solve problems, such as air pollution, caused by existing gasoline and diesel vehicles using fossil fuel. As a result, the secondary batteries are being applied to an increasing number of applications owing to advantages thereof, and, in the future, the secondary batteries are expected to be applied to even more applications and products.

As applications and products, to which the secondary batteries are applicable, are increased, kinds of batteries are also increased such that the batteries can provide powers and capacities corresponding to the various applications and products. Furthermore, there is a strong need to reduce the size and weight of the batteries applied to the corresponding applications and products.

For example, small-sized mobile devices, such as mobile phones, personal digital assistants (PDA), digital cameras, and laptop computers, use one or several small-sized, lightweight battery cells for each device according to the reduction in size and weight of the corresponding products. On the other hand, middle- or large-sized devices, such as electric bicycles, electric motorcycles, electric vehicles, and hybrid electric vehicles, use a middle- or large-sized battery module (or battery pack) having a plurality of battery cells electrically connected with each other because high power and large capacity is necessary for the middle- or large-sized devices.

In a middle- or large-sized secondary battery module including a plurality of battery cells (unit cells), all of the battery cells or some of the battery cells are connected in series to one another so as to provide, particularly, high power. Preferably, the battery cells have the same capacity and voltage standard. Despite having the same standard, however, the battery cells generally have different voltages due to limitation in a manufacturing process caused by various factors. That is, there is a voltage difference between the respective battery cells. If the battery cells constituting the battery module have different voltages, the performance of the battery module is deteriorated. Also, a voltage difference between the respective battery cells may occur due to various factors during use of the battery module as well as during manufacture of the battery module.

Therefore, there is a high necessity for technology that is capable of minimizing a voltage difference between battery cells to ensure that a battery module operates in an optimal state.

DISCLOSURE

Technical Problem

Therefore, the present invention has been made to solve the above problems, and other technical problems that have yet to be resolved.

Specifically, it is an object of the present invention to provide a battery cell voltage balancing device that is capable of connecting a plurality of battery cells constituting a battery module to one another in parallel so as to minimize a voltage difference between the respective battery cells, thereby optimizing performance of the battery module.

It is another object of the present invention to provide a battery cell voltage balancing device including an insulative main body, terminal connections, and an interval adjustment unit, all of which are configured in specific structures, thereby achieving convenience in a battery cell voltage balancing process.

Technical Solution

In accordance with one aspect of the present invention, the above and other objects can be accomplished by the provision of a battery cell voltage balancing device for connecting two or more battery cells to one another in parallel so as to minimize a voltage difference between the respective battery cells, the battery cell voltage balancing device including an insulative main body having partitions, between which the two or more battery cells are mounted, respectively, configured in a structure in which the partitions are open upward, terminal connection parts disposed at opposite ends of the insulative main body for connecting cathodes and anodes of the battery cells mounted at the insulative main body to cathodes and anodes of neighboring battery cells mounted at the insulative main body, and an interval adjustment unit for variably adjusting an interval between the partitions in a state in which the battery cells are mounted between the partitions to achieve secure mounting of the battery cells between the respective partitions and electrical connection of electrode terminals of the respective battery cells to the terminal connection parts.

A plurality of battery cells used to manufacture a battery module may be mounted in the battery cell voltage balancing device according to the present invention such that voltage balancing between the respective battery cells is performed to minimize a voltage difference between the respective battery cells, thereby optimizing performance of the battery module. Also, a battery cell voltage balancing process may be more easily and conveniently performed.

In the battery cell voltage balancing device according to the present invention, a plurality of battery cells are connected in parallel to one another so as to minimize a voltage difference between the respective battery cells. That is, when a plurality of battery cells used to manufacture a battery module are connected in parallel to one another for a predetermined period of time using the battery cell voltage balancing device according to the present invention during manufacture or use of the battery module, a voltage difference between the respective battery cells is minimized, thereby ensuring optimal performance of the battery module. The number of the battery cells is not particularly restricted as long as the battery cells can be connected in parallel to each other. For example, two to fifty battery cells may be used. The number of the partitions is decided based on the number of the battery cells.

Kind of the battery cells is not particularly restricted as long as the battery cells are secondary batteries that can be charged and discharged. Preferably, each of the battery cells is a lithium secondary battery using a lithium transition metal oxide and/or a composite oxide as a cathode active material. Also, shape of the battery cells is not particularly restricted. Preferably, each of the battery cells is a plate-shaped or prismatic battery cell configured in a structure in which a cathode and an anode are disposed at opposite ends of the battery cell such that the battery cell can be easily mounted in the battery cell voltage balancing device according to the present invention. Each of the battery cells is configured in a structure in which an electrode assembly of a cathode/separator/anode structure is contained in a battery case formed of a laminate sheet including a resin layer and a metal layer together with an electrolyte.

As previously described, the main body of the battery cell voltage balancing device is formed of an insulative material, and the partitions, between which two or more battery cells are mounted, are configured in an upwardly open structure.

When the battery cells are mounted between the respective partitions such that voltage balancing between the battery cells is performed, the cathodes and the anodes of the respective battery cells are located at the terminal connection parts disposed at the opposite ends of the insulative main body. Consequently, the terminal connection parts are connected to the cathodes and the anodes of the neighboring battery cells.

In a preferred example, the insulative main body may include mounting parts for surrounding opposite sides of the lower parts of the respective battery cells when the battery cells are mounted between the respective partitions at positions where the electrode terminals of the respective battery cells correspond to the terminal connection parts and side parts extending upward from opposite ends of the respective mounting parts such that the terminal connection parts are mounted at the side parts.

In the above structure, the terminal connection parts may include first connection parts mounted to the side parts of the insulative main body such that the first connection parts contact the electrode terminals of the respective battery cells and second connection parts for electrically connecting the first connection parts to corresponding first connection parts of the neighboring terminal connection parts.

In a preferred example, the first connection parts may be conductive strips, and the second connection parts may be conductive wires.

In the above construction, the conductive strips are configured in a structure in which electrode terminal facing portions of the conductive strips facing the electrode terminals of the respective battery cells are bent such that the conductive strips contact the electrode terminals of the respective battery cells in a state in which the conductive strips are elastically pressed against the electrode terminals of the respective battery cells so as to improve reliability of contact between the electrode terminals of the respective battery cells and the terminal connection parts.

For example, one end of each of the conductive strips, which are elastically bent, is fixed to a corresponding one of the side parts of the insulative main body, and the electrode terminal facing portions of the conductive strips are bent approximately in a V shape. As a result, the conductive strips exhibit the same elasticity as leaf springs. Consequently, the conductive strips contact the electrode terminals of the respective battery cells in a state in which the conductive strips are elastically pressed against the electrode terminals of the respective battery cells, and therefore, it is possible to stably achieve electrical connection between the electrode terminals of the respective battery cells and the conductive strips without accurately adjusting the distance between the electrode terminals of the respective battery cells and the conductive strips Electrical connection between the conductive strips and the conductive wires may be achieved in various manners. Preferably, the conductive strips and the conductive wires are coupled to the side parts of the insulative main body by means of conductive screws. This structure is preferable in that electrical connection between the conductive strips and the conductive wires is achieved while the conductive strips and the conductive wires are simultaneously coupled to the side parts of the insulative main body.

In an example of the above structure, in order for terminal connection parts (b, c) of the side parts located at opposite sides of a terminal connection part (a) to be electrically connected to the terminal connection part (a), two conductive wires connected to the terminal connection parts (b, c) may be coupled to a conductive strip mounted to the terminal connection part (a).

As previously described, the interval adjustment unit is included in the battery cell voltage balancing device according to the present invention. The interval adjustment unit variably adjusts the interval between the respective partitions in a state in which the battery cells are mounted between the respective partitions and, in addition, achieves mounting of the battery cells between the respective partitions and electrical connection between the electrode terminals of the respective battery cells and the terminal connection parts.

In a preferred example, the partitions may be disposed on a base plate, and the interval adjustment unit may include at least one bar extending through the partitions in a state in which opposite ends of the at least one bar are fixed to the base plate, compression springs fitted on the at least one bar such that the compression springs are disposed between the respective partitions, and a handle fixed to one side of the base plate for adjusting a distance between the base plate and an outermost one of the partitions.

Preferably, the handle includes a fixed plate extending upward from the base plate, the fixed plate having a through hole, a movable plate mounted to an outside of the outermost partition, the movable plate having a threaded through hole, at the inside of which is formed a thread part, and a screw bar fixed to the fixed plate such that the screw bar extends through the through hole of the fixed plate and the threaded through hole of the movable plate, the screw bar having a thread part formed at the outside thereof.

By the provision of the above structure, the interval between the respective partitions may be adjusted by the interval adjustment unit.

Specifically, the bar of the interval adjustment unit extends through the partitions in a state in which opposite ends of the bar 510 are fixed to the base plate. The partitions are moved along the bar in the axial direction of the bar according to operating conditions. At this time, the interval between the respective partitions is uniformly maintained by the compression springs fitted on the bar. That is, the compression springs apply predetermined pressure to sides of the respective partitions such that the interval between the respective partitions is uniformly maintained.

The interval between the respective partitions is adjusted by the handle. That is, when pressing force is applied to the partitions or application of the pressing force to the partitions is released through manipulation of the handle, the partitions are moved in the axial direction of the bar extending through the partitions.

Meanwhile, the screw bar is rotated while the screw bar is supported by the through hole of the fixed plate, and the thread part formed at the inside of the threaded through hole of the movable plate is engaged with the thread part formed at the outside of the screw bar. When the screw bar is rotated through manipulation of the handle, therefore, the movable plate is moved in the advancing direction of the thread part. Since the movable plate is moved forward and backward to variably adjust the interval between the respective partitions through manipulation of the handle of the interval adjustment unit as described above, it is possible to widen the interval between the respective partitions such that the battery cells can be easily mounted between the respective partitions and then to narrow the interval between the respective partitions such that electrical connection between the electrode terminals of the respective battery cells can be achieved.

The battery cell voltage balancing device according to the present invention may further include a detection/display unit for measuring voltage of the respective battery cells and displaying the measured voltage of the respective battery cells and balancing time.

The detection/display unit may be configured, for example, in a structure including a voltage measuring instrument, detection terminals mounted to the side parts of the insulative main body, conductive wires for connecting the detection terminals to the voltage measuring instrument, and a monitor for displaying detected voltage and balancing time.

In a preferred example, cathode detection terminals of the detection terminals may be mounted to the respective side parts, and an anode detection terminal of the detection terminals may be mounted to one of the side parts. Also, the anode detection terminal may be connected to the conductive strip of a corresponding one of the anode terminal connection parts of the side parts.

Two anode terminal connection parts may be mounted to each of the side parts.

The measurement of voltage of the battery cells is performed so as to individually measure the voltage of the respective battery cells. To this end, it is preferable for the cathode detection terminals to be mounted to the respective side parts such that the respective battery cells are individually connected to the voltage measuring instrument.

Since the cathode detection terminals are mounted to the respective side parts as described above, the battery cells are also individually connected to the voltage measuring instrument such that voltage of the respective battery cells is individually measured.

Voltage balancing between the respective battery cells may be controlled based on a result obtained from the detection/display unit.

To this end, the battery cell voltage balancing device according to the present invention may further include a controller for controlling voltage balancing between the respective battery cells.

Kind of the controller for controlling voltage balancing between the respective battery cells is not particularly restricted as long as the controller can control voltage balancing between the respective battery cells. For example, the controller may be a personal computer (PC).

The controller may be included in the battery cell voltage balancing device according to the present invention or may be connected to the battery cell voltage balancing device according to the present invention by means of additional input and output terminals and wires.

Parallel connection time may be changed based on various factors, such as the number, voltage, capacity, and desired level of the battery cells. In a preferred example, the voltage balancing may be controlled such that voltages of the respective battery cells equalized through parallel connection between the respective battery cells coincide with each other to within 0.001 V.

Voltage balancing between the battery cells using the battery cell voltage balancing device according to the present invention may be performed in an arbitrary time zone during manufacture or use of the battery module. At the time of manufacturing the battery module, it is preferable to perform voltage balancing between the battery cells before the battery cells are connected in series to one another.

In accordance with another aspect of the present invention, there is provided a battery module including at least two battery cells, between which a voltage difference is minimized using the battery cell voltage balancing device according to the present invention.

When the voltage difference between the respective battery cells constituting the battery module is minimized, the battery module may be operated in an optimal state. Consequently, it is preferable to manufacture the battery module using the battery cells between which the voltage difference is minimized such that the battery module exhibits optimal performance.

Various structures of a battery module including a plurality of battery cells are well known in the art to which the present invention pertains, and therefore, a detailed description thereof will not be given.

Advantageous Effects

As is apparent from the above description, the battery cell voltage balancing device according to the present invention connects a plurality of battery cells constituting a battery module to one another in parallel so as to minimize a voltage difference between the respective battery cells, thereby optimizing performance of the battery module.

Also, a plurality of battery cells used to manufacture a battery module is mounted in the battery cell voltage balancing device according to the present invention such that voltage balancing between the respective battery cells is performed, and positions of partitions of the battery cell voltage balancing device are variably changed such that the battery cells can be easily mounted between the respective partitions, thereby more easily and conveniently performing a battery cell voltage balancing process.

BRIEF DESCRIPTION OF THE DRAWINGS

The above and other objects, features and other advantages of the present invention will be more clearly understood from the following detailed description taken in conjunction with the accompanying drawings, in which.

BEST MODE

Now, exemplary embodiments of the present invention will be described in detail with reference to the accompanying drawings. It should be noted, however, that the scope of the present invention is not limited by the illustrated embodiments.

Figure 1:
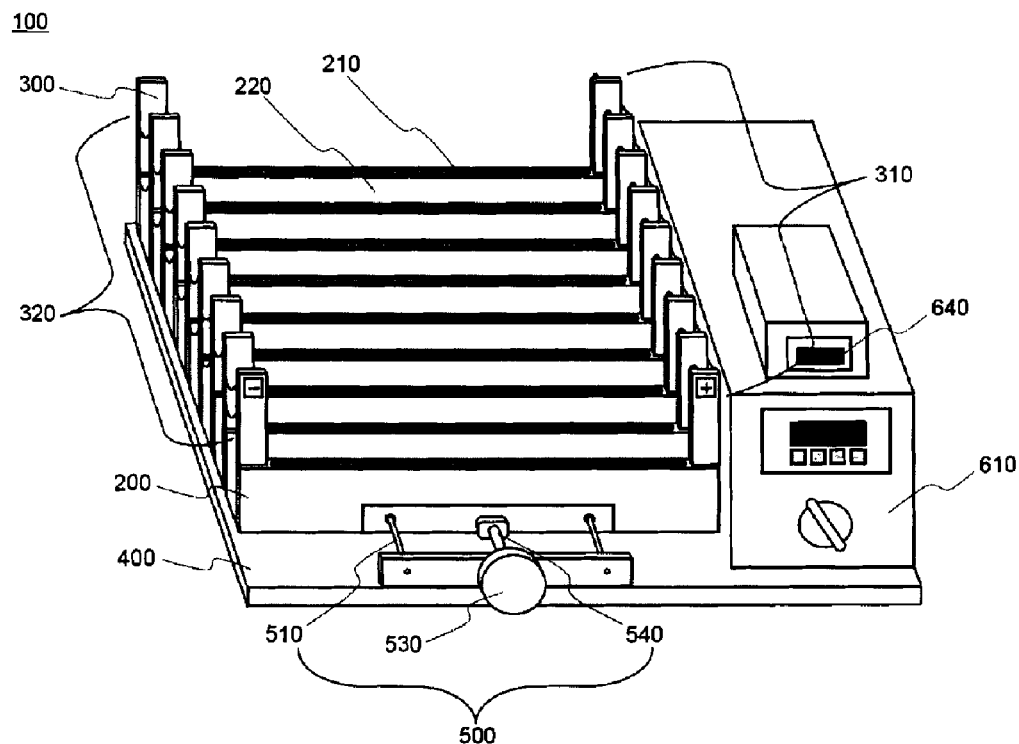
FIG. 1 is a perspective view illustrating a battery cell voltage balancing device according to an embodiment of the present invention.

FIG. 1 is a perspective view illustrating a battery cell voltage balancing device according to an embodiment of the present invention.

Referring to FIG. 1, a battery cell voltage balancing device 100 according to an embodiment of the present invention includes an insulative main body 200 having a plurality of partitions 210, between which a plurality of battery cells are mounted, respectively, configured in a structure in which the partitions 210 are open upward, terminal connection parts 310 and 320 disposed at opposite ends of the insulative main body 200 (cathode terminal connection parts 310 and anode terminal connection parts 320), and an interval adjustment unit 500 configured to variably adjust an interval between the partitions 210 in a state in which the battery cells (not shown) are mounted between the partitions 210.

The insulative main body 200 includes mounting parts 220 configured to surround opposite sides of the lower parts of the respective battery cells when the battery cells are mounted between the respective partitions 210 and side parts 300 extending upward from opposite ends of the respective mounting parts 220 such that the terminal connection parts 310 and 320 are mounted at the side parts 300.

Also, the battery cell voltage balancing device 100 further includes a detection/display unit disposed at one side of the insulative main body 200 for measuring voltage of the respective battery cells and displaying the measured voltage of the respective battery cells and balancing time.

The detection/display unit is configured in a structure including a voltage measuring instrument 610, detection terminals 620 and 630 mounted to the side parts 300 of the insulative main body 200, conductive wires 621 and 631 configured to connect the detection terminals 620 and 630 to the voltage measuring instrument 610, and a monitor 640 configured to display detected voltage and balancing time.

Figure 2:
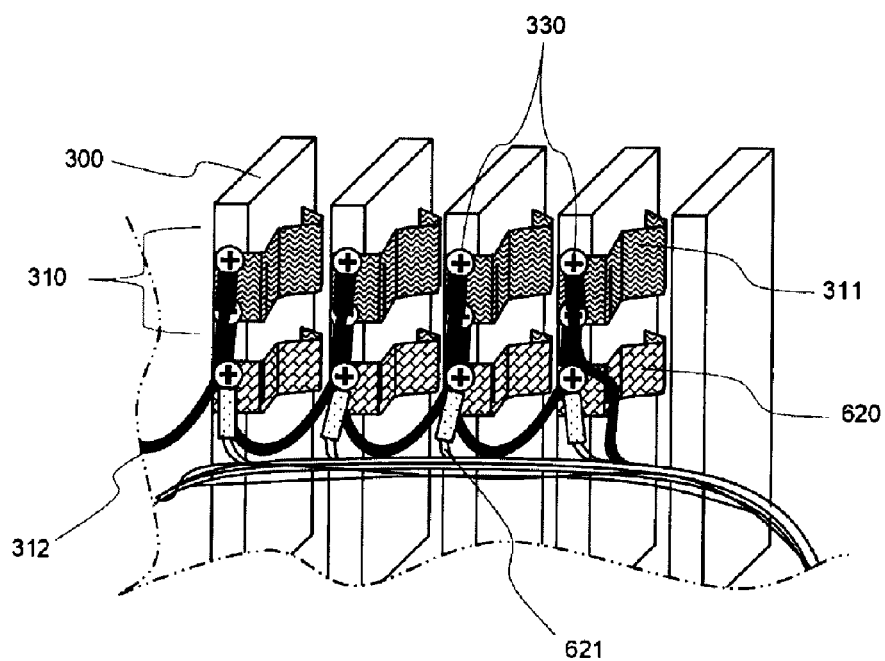
FIG. 2 is a view illustrating cathode terminal connection parts of the battery cell voltage balancing device according to the embodiment of the present invention.
Figure 3:
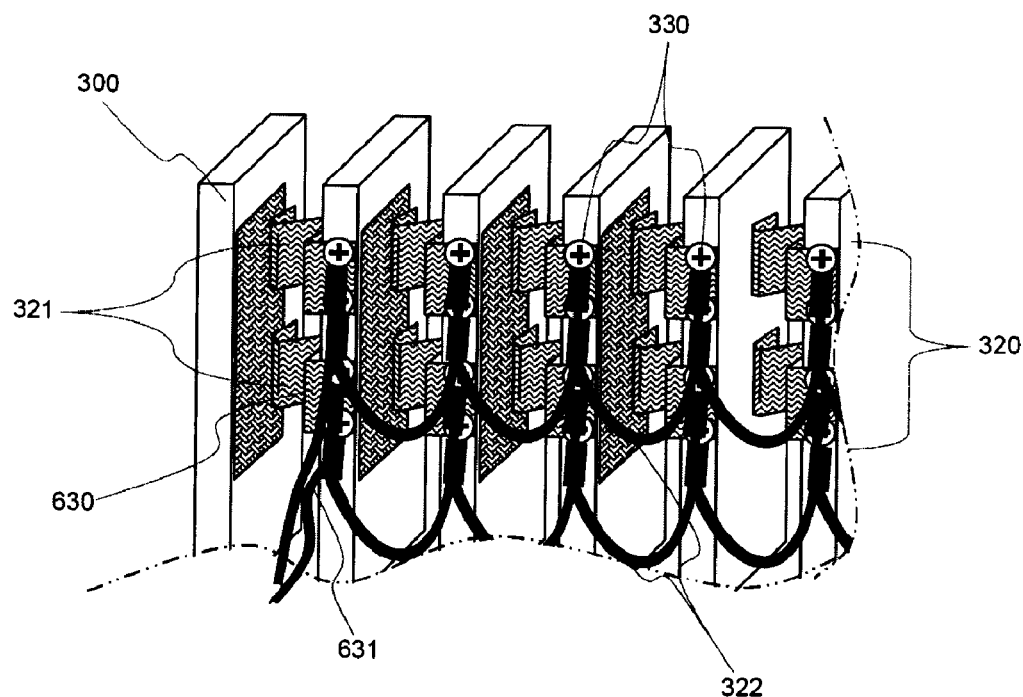
FIG. 3 is a view illustrating anode terminal connection parts of the battery cell voltage balancing device according to the embodiment of the present invention.

FIGS. 2 and 3 illustrate the cathode terminal connection parts and the anode terminal connection parts of the battery cell voltage balancing device according to the embodiment of the present invention, respectively.

Referring to these drawings, the terminal connection parts 310 and 320 include conductive strips 311 and 321 mounted to the side parts 300 of the insulative main body 200 such that the conductive strips 311 and 321 contact electrode terminals of the respective battery cells and conductive wires 312 and 322 configured to electrically connect the conductive strips 311 and 321 to corresponding conductive strips 311 and 321 of the neighboring terminal connection parts.

The conductive strips 311 and 321 are configured in a structure in which electrode terminal facing portions of the conductive strips 311 and 321 facing the electrode terminals of the respective battery cells are bent such that the conductive strips 311 and 321 contact the electrode terminals of the respective battery cells in a state in which the conductive strips 311 and 321 are elastically pressed against the electrode terminals of the respective battery cells.

The conductive strips 311 and 321 and the conductive wires 312 and 322 are coupled to the side parts 300 of the insulative main body 200 by means of conductive screws 330.

Two conductive wires 312 and 322, electrically interconnecting the terminal connection parts 310 and 320 of the side parts 300 located at opposite sides of each of the conductive strips 311 and 321, are coupled to each of the conductive strips 311 and 321. The conductive wires 312 and 322 serve to electrically interconnect the terminal connection parts 310 and 320 of the side parts 300.

One end of each of the conductive strips 311 and 321, which are elastically bent, is fixed to a corresponding one of the side parts 300 of the insulative main body 200 by means of the conductive screws 330. The electrode terminal facing portions of the conductive strips 311 and 321 are bent approximately in a V shape. Consequently, the conductive strips 311 and 321 are elastically pressed against the electrode terminals of the respective battery cells (not shown), thereby achieving stable contact between the conductive strips 311 and 321 and the electrode terminals of the respective battery cells.

Referring to FIG. 3, two anode terminal connection parts 320 are mounted to each of the side parts 300. Since two anode terminal connection parts 320 are mounted to each of the side parts 300, it is possible to achieve more stable electrical connection.

Referring to FIGS. 2 and 3, the cathode detection terminals 620 are mounted to the respective side parts 300, and the anode detection terminal 630 is mounted to one of the side parts 300.

The measurement of voltage of the battery cells is performed so as to individually measure the voltage of the respective battery cells. To this end, the cathode detection terminals 620 are mounted to the respective side parts 300 such that the respective battery cells are individually connected to the voltage measuring instrument 610 (see FIG. 1). However, it is not necessary for the anode detection terminal 630 to be mounted to each of the side parts 300. The anode detection terminal 630 is connected to the conductive strip 321 of a corresponding one of the anode terminal connection parts 320, with the result that the anode detection terminal 630 is connected to the anodes of the respective battery cells.

Since the cathode detection terminals 620 are mounted to the respective side parts 300 as described above, the battery cells are also individually connected to the voltage measuring instrument 610 such that voltages of the respective battery cells are individually measured.

Figure 4:
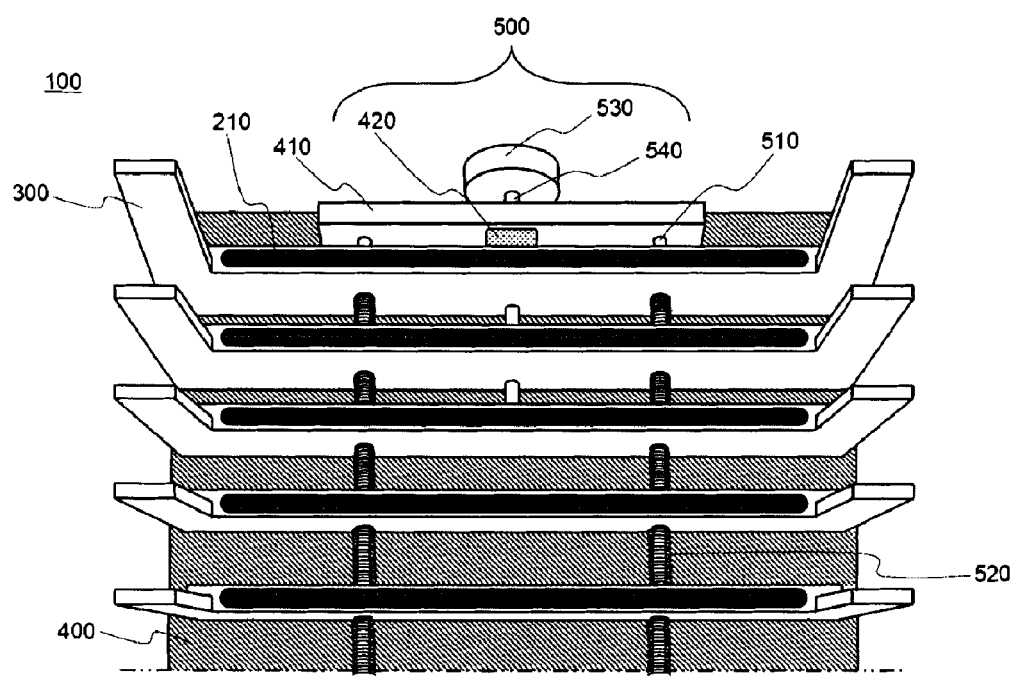
FIG. 4 is a view typically illustrating a state in which an interval between respective partitions is widened in the battery cell voltage balancing device according to the embodiment of the present invention.

FIG. 4 is a plan perspective view of the battery cell voltage balancing device according to the embodiment of the present invention.

Referring to FIG. 4, the partitions 210 are movably disposed on a base plate 400.

The interval adjustment unit 500 is configured in a structure including a pair of bars 510 extending through the partitions 210 in a state in which opposite ends of the bars 510 are fixed to the base plate 400, compression springs 520 fitted on the bars 510 such that the compression springs 520 are disposed between the respective partitions 210, and a handle 530 fixed to one side of the base plate 400 for adjusting the distance between the base plate 400 and an outermost one 210' of the partitions 210.

The handle 530 includes a fixed plate 410 extending upward from the base plate 400, the fixed plate 410 having a through hole 411, a movable plate 420 mounted to the outside of the outermost partition 210', the movable plate 420 having a threaded through hole 421, at the inside of which is formed a thread part, and a screw bar 540 fixed to the fixed plate 410 such that the screw bar 540 extends through the through hole 411 of the fixed plate 410 and the threaded through hole 421 of the movable plate 420, the screw bar 540 having a thread part formed at the outside thereof.

Figure 5:
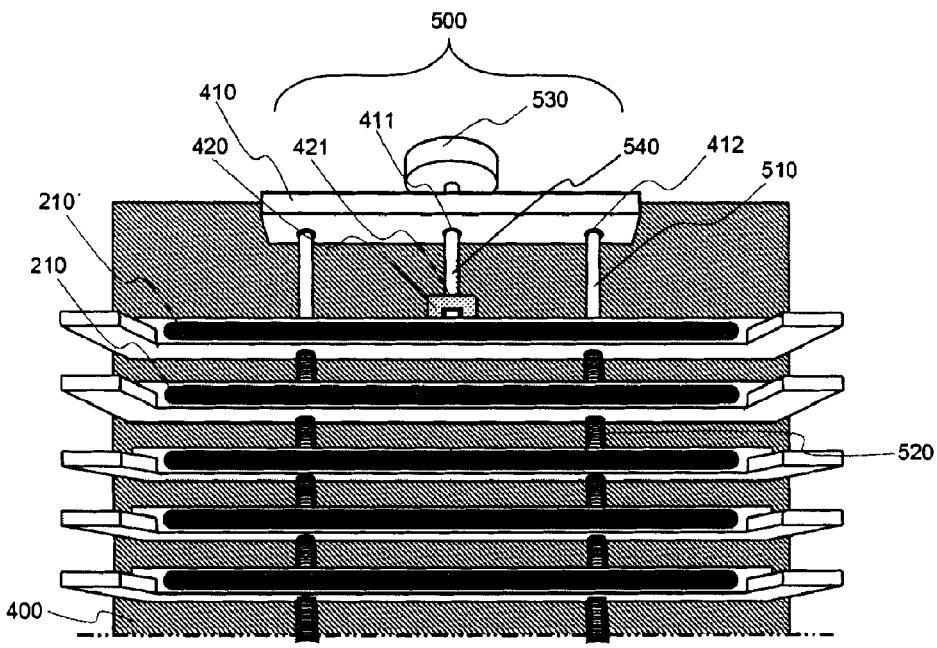
FIG. 5 is a view typically illustrating a state in which the interval between the respective partitions is narrowed in the battery cell voltage balancing device according to the embodiment of the present invention.

FIG. 5 is a view typically illustrating a state in which the interval between the respective partitions is narrowed by the interval adjustment unit in the battery cell voltage balancing device of FIG. 4.

Referring to FIG. 5, the interval between the respective partitions 210 is adjusted by the handle 530. That is, the handle 530 is fixed to one side of the base plate 400 such that the interval between the respective partitions 210 is adjusted through manipulation of the handle 530.

The screw bar 540 extends through the through hole 411 of the fixed plate 410.

The screw bar 540 is configured to be rotated while the position of the screw bar 540 is fixed by the through hole 411 of the fixed plate 410. Also, the screw bar 540 extends through the threaded through hole 421 of the movable plate 420. The thread part formed at the inside of the threaded through hole 421 is engaged with the thread part formed at the outside of the screw bar 540. When the screw bar 540 is rotated through manipulation of the handle 530, therefore, the movable plate 420 is moved in the advancing direction of the thread part. Since the movable plate 420 is fixed to the outside of the outermost partition 210', the interval between the respective partitions 210 is adjusted according to the movement of the movable plate 420. That is, the movable plate 420 is moved forward and backward in the axial direction of the screw bar 540 according to the rotation direction of the handle 530.

Since the movable plate 420 is moved forward and backward to variably adjust the interval between the respective partitions 210 through manipulation of the handle 530 of the interval adjustment unit 500 as described above, it is possible to widen the interval between the respective partitions such that the battery cells can be easily mounted between the respective partitions and then to narrow the interval between the respective partitions such that electrical connection between the electrode terminals of the respective battery cells can be achieved.

Figure 6:
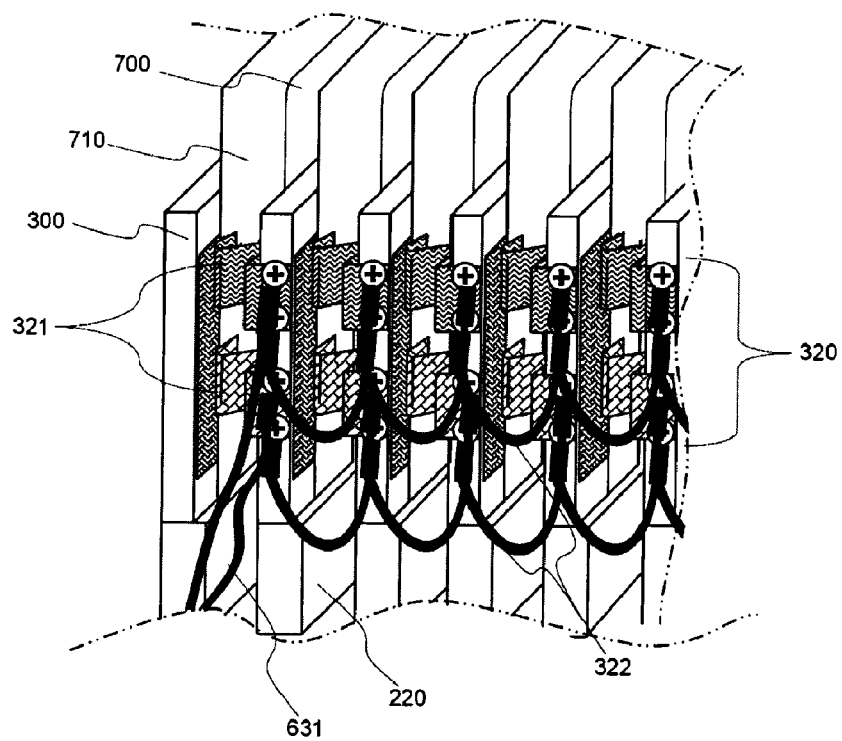
FIG. 6 is a view illustrating the anode terminal connection parts of the battery cell voltage balancing device according to the embodiment of the present invention in a state in which battery cells are mounted in the battery cell voltage balancing device.

FIG. 6 is a partial perspective view typically illustrating an example of the battery cell voltage balancing device according to the embodiment of the present invention in a state in which battery cells are mounted in the battery cell voltage balancing device. That is, only the anode terminal connection parts 320 of the battery cell voltage balancing device 100 are shown in FIG. 6.

Referring to FIG. 6 together with FIGS. 2 and 5, battery cells 700 are mounted between the respective partitions 210 in a state in which the interval between the respective partitions 210 is widened (see FIG. 2), and the battery cells 700 are fixed by the mounting parts 220, which surround the opposite sides of the lower parts of the respective battery cells 700. When the battery cells 700 are mounted between the respective partitions 210, electrode terminals 710 of the respective battery cells 700 are located at positions corresponding to the terminal connection parts 320.

The battery cells 700 are mounted in the battery cell voltage balancing device 100 in a state in which the interval between the respective partitions 210 is widened. Consequently, easy mounting of the battery cells 700 in the battery cell voltage balancing device 100 is achieved without the battery cells 700 being disturbed by the terminal connection parts 320 located at positions corresponding to the electrode terminals 710 of the respective battery cells 700.

After the battery cells 700 are mounted in the battery cell voltage balancing device 100, the handle 530 of the interval adjustment unit 500 is manipulated to narrow the interval between the respective partitions 210, as shown in FIG. 5, with the result that the conductive strips 321 contact the electrode terminals 710 of the respective battery cells 700 in a state in which the conductive strips 321 are elastically pressed against the electrode terminals 710 of the respective battery cells 700.

Since the conductive strips 321 are elastically pressed against the electrode terminals 710 of the respective battery cells 700, it is possible to stably achieve electrical connection between the electrode terminals 710 of the respective battery cells 700 and the conductive strips 321 without accurately adjusting the interval between the respective partitions 210.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A battery cell voltage balancing device for connecting two or more battery cells to one another in parallel so as to minimize a voltage difference between the respective battery cells, the battery cell voltage balancing device comprising:
an insulative main body having partitions, between which the two or more battery cells are mounted, respectively, configured in a structure in which the partitions are open upward;
terminal connection parts disposed at opposite ends of the insulative main body for connecting cathodes and anodes of the battery cells mounted at the insulative main body to cathodes and anodes of neighboring battery cells mounted at the insulative main body; and
an interval adjustment unit for variably adjusting an interval between the partitions in a state in which the battery cells are mounted between the partitions to achieve secure mounting of the battery cells between the respective partitions and electrical connection of electrode terminals of the respective battery cells to the terminal connection parts, wherein the partitions are disposed on a base plate, and
the interval adjustment unit comprises at least one bar extending through the partitions in a state in which opposite ends of the at least one bar are fixed to the base plate, compression springs fitted on the at least one bar such that the compression springs are disposed between the respective partitions, and a handle fixed to one side of the base plate for adjusting a distance between the base plate and an outermost one of the partitions.

2. The battery cell voltage balancing device according to claim 1, wherein each of the battery cells is a plate-shaped or prismatic battery cell configured in a structure in which a cathode and an anode are disposed at opposite ends of the battery cell.

3. The battery cell voltage balancing device according to claim 2, wherein each of the battery cells is configured in a structure in which an electrode assembly of a cathode/separator/anode structure is contained in a battery case formed of a laminate sheet including a resin layer and a metal layer together with an electrolyte.

4. The battery cell voltage balancing device according to claim 1, wherein the insulative main body comprises mounting parts for surrounding opposite sides of lower parts of the respective battery cells when the battery cells are mounted between the respective partitions at positions where the electrode terminals of the respective battery cells correspond to the terminal connection parts and side parts extending upward from opposite ends of the respective mounting parts such that the terminal connection parts are mounted at the side parts.

5. The battery cell voltage balancing device according to claim 4, wherein the terminal connection parts comprise first connection parts mounted to the side parts of the insulative main body such that the first connection parts contact the electrode terminals of the respective battery cells and second connection parts for electrically connecting the first connection parts to corresponding first connection parts of the neighboring terminal connection parts.

6. The battery cell voltage balancing device according to claim 5, wherein the first connection parts are conductive strips, and the second connection parts are conductive wires.

7. The battery cell voltage balancing device according to claim 6, wherein the conductive strips are configured in a structure in which electrode terminal facing portions of the conductive strips facing the electrode terminals of the respective battery cells are bent such that the conductive strips contact the electrode terminals of the respective battery cells in a state in which the conductive strips are elastically pressed against the electrode terminals of the respective battery cells.

8. The battery cell voltage balancing device according to claim 6, wherein the conductive strips and the conductive wires are coupled to the side parts of the insulative main body by means of conductive screws.

9. The battery cell voltage balancing device according to claim 6, wherein two conductive wires, electrically interconnecting the terminal connection parts of the side parts located at opposite sides of each of the conductive strips, are coupled to each of the conductive strips.

10. The battery cell voltage balancing device according to claim 1, wherein the handle comprises a fixed plate extending upward from the base plate, the fixed plate having a through hole, a movable plate mounted to an outside of the outermost partition, the movable plate having a threaded through hole, at an inside of which is formed a thread part, and a screw bar fixed to the fixed plate such that the screw bar extends through the through hole of the fixed plate and the threaded through hole of the movable plate, the screw bar having a thread part formed at an outside thereof.

11. The battery cell voltage balancing device according to claim 1, further comprising a detection/display unit for measuring voltage of the respective battery cells and displaying the measured voltage of the respective battery cells and balancing time.

12. The battery cell voltage balancing device according to claim 11, wherein the detection/display unit comprises a voltage measuring instrument, detection terminals mounted to the side parts of the insulative main body, conductive wires for connecting the detection terminals to the voltage measuring instrument, and a monitor for displaying detected voltage and balancing time.

13. The battery cell voltage balancing device according to claim 12, wherein cathode detection terminals of the detection terminals are mounted to the respective side parts, and an anode detection terminal of the detection terminals is mounted to one of the side parts.

14. The battery cell voltage balancing device according to claim 13, wherein the anode detection terminal is connected to the conductive strip of a corresponding one of the anode terminal connection parts of the side parts.

15. The battery cell voltage balancing device according to claim 13, wherein two anode terminal connection parts are mounted to each of the side parts.

16. The battery cell voltage balancing device according to claim 11, further comprising a controller for controlling voltage balancing between the respective battery cells based on a result obtained from the detection/display unit.

17. The battery cell voltage balancing device according to claim 16, wherein the voltage balancing is controlled such that voltages of the respective battery cells equalized through parallel connection between the respective battery cells coincide with each other to within 0.001 V.

18. The battery cell voltage balancing device according to claim 16, wherein the controller is a personal computer (PC).

19. A battery module comprising at least two battery cells, between which a voltage difference is minimized using the battery cell voltage balancing device according to claim 1.

* * * * *